United States Patent
Alho

(10) Patent No.: US 11,901,904 B2
(45) Date of Patent: Feb. 13, 2024

(54) DIGITALLY CONTROLLED OSCILLATOR FOR A SYNTHESIZER MODULE, SYNTHESIZER MODULE, SYNTHESIZER, AND METHOD FOR PRODUCING AN ELECTRICAL AUDIO SIGNAL

(71) Applicant: SUPERCRITICAL OY, Tampere (FI)

(72) Inventor: Timo Alho, Tampere (FI)

(73) Assignee: SUPERCRITICAL OY, Tampere (FI)

( * ) Notice: Subject to any disclaimer, the term of this patent is extended or adjusted under 35 U.S.C. 154(b) by 326 days.

(21) Appl. No.: 17/440,254

(22) PCT Filed: Mar. 18, 2020

(86) PCT No.: PCT/EP2020/057379
§ 371 (c)(1),
(2) Date: Sep. 17, 2021

(87) PCT Pub. No.: WO2020/187960
PCT Pub. Date: Sep. 24, 2020

(65) Prior Publication Data
US 2022/0173728 A1 Jun. 2, 2022

(30) Foreign Application Priority Data
Mar. 18, 2019 (FI) ........................ 20195199

(51) Int. Cl.
*H03K 4/56* (2006.01)
*H03K 4/06* (2006.01)
(Continued)

(52) U.S. Cl.
CPC ......... *H03K 4/066* (2013.01); *H03F 3/45475* (2013.01); *H03K 4/56* (2013.01); *H03L 7/183* (2013.01)

(58) Field of Classification Search
None
See application file for complete search history.

(56) References Cited

U.S. PATENT DOCUMENTS 4,085,648 A 4/1978 Fricke et al.
4,173,915 A 11/1979 Gross
(Continued)

FOREIGN PATENT DOCUMENTS

KR 100188287 B1 6/1999

OTHER PUBLICATIONS

International Search Report and Written Opinion dated Jun. 15, 2020 in PCT/EP2020/057379 (12 pages).

*Primary Examiner* — Jakieda R Jackson
(74) *Attorney, Agent, or Firm* — Meunier Carlin & Curfman LLC

(57) ABSTRACT

A digitally controlled oscillator (100), a synthesizer module (200), a synthesizer (300), and a method for producing an electrical audio signal are presented. The oscillator (100) comprises a digital processing unit (10) configured to generate a first pulse wave at a first output (PulseUp) of the processing unit (10), wherein the first pulse wave is arranged to include pulses at at least two different frequencies. The oscillator (100) further comprises a summing circuit (30) and a linear wave shaper (20). The output (PulseUp) of the processing unit (10) is connected to the summing circuit (30) which is arranged to produce a resultant signal based on at least the first pulse wave. The resultant signal is arranged to be fed into the linear wave shaper (20) which is arranged to produce an output signal at the output (OUT) of the oscillator (100) based on modifying the resultant signal.

15 Claims, 5 Drawing Sheets

(51) Int. Cl.
*H03F 3/45* (2006.01)
*H03L 7/183* (2006.01)

(56) References Cited

U.S. PATENT DOCUMENTS

| | | | |
|---|---|---|---|
| 4,409,877 A | 10/1983 | Budelman | |
| 4,475,228 A | 10/1984 | Vickers | |
| 4,554,855 A | 11/1985 | Alonso | |
| 5,648,778 A | 7/1997 | Linz et al. | |
| 7,724,161 B1 | 5/2010 | Cyrusian | |
| 2004/0086060 A1* | 5/2004 | Tsubata | A61B 5/721 600/300 |
| 2008/0055010 A1* | 3/2008 | Lerner | H03K 5/13 331/37 |
| 2009/0302943 A1 | 12/2009 | Chen et al. | |
| 2011/0069738 A1* | 3/2011 | Sugino | G01S 13/10 375/E1.001 |
| 2015/0109056 A1 | 4/2015 | Lesso et al. | |

\* cited by examiner

US 11,901,904 B2

DIGITALLY CONTROLLED OSCILLATOR FOR A SYNTHESIZER MODULE, SYNTHESIZER MODULE, SYNTHESIZER, AND METHOD FOR PRODUCING AN ELECTRICAL AUDIO SIGNAL

CROSS REFERENCE TO RELATED APPLICATIONS

This application is a United States National Phase Patent Application of International Patent Application Number PCT/EP2020/057379, filed on Mar. 18, 2020, which claims the benefit of priority to FI Application No. 20195199, filed on Mar. 18, 2019, the contents of which are incorporated by reference herein in their entireties.

FIELD OF THE INVENTION

The present invention relates in general to electronic oscillators. In particular, however, not exclusively, the present invention concerns digitally controlled oscillators for use in audio devices.

BACKGROUND

There are known ways to produce saw and pulse waveforms electronically with a wide range of frequency control.

A voltage-controlled oscillator (VCO) based on a relaxation oscillator is essentially a voltage-controlled ramp generator with a reset circuit set to trigger once the ramp reaches a certain threshold. This produces a sawtooth wave which is then wave-shaped to produce other output waveforms. A common variation is to switch the direction of integration to produce a triangle wave instead.

A digitally controlled oscillator (DCO) replaces the reset circuit of the VCO with a digitally controlled reset. This brings the advantage that the frequency can be controlled by pulses subdivided from a very high frequency and very stable clock.

In direct digital synthesis (DDS), the waveform itself is generated as a digital stream of numbers in a digital signal processor (DSP), which are then fed to a digital-to-analog-converter (DAC) clocked at a sample rate which is at least several times the highest desired waveform output frequency based on the Nyquist criterion.

If, on the other hand, it is desired to generate several simultaneous waveforms with independently controllable frequencies, in the case of the VCO and the DCO, the analog circuitry must be replicated in its entirety for each frequency. The DDS method, however, generalizes immediately to producing multiple waveforms. If sufficient DSP power is available, the waveforms can be simply generated separately, and then summed before the DAC, requiring no further analog components. The DSP requirements typically scale in proportion to the number of individual waveforms.

However, in the DDS method, producing the waveform by simply counting the phase of the oscillator and outputting the corresponding instantaneous sample value is essentially equivalent to sampling a continuous time waveform. When the waveform has many harmonics, such as saw and pulse waves, some of these harmonics will be at frequencies above the Nyquist bound $F_s/2$, where $F_s$ is the sampling frequency, and will alias down to the baseband $0 \le f < F_s/2$. In case of audio applications, the human hearing is extremely sensitive to these non-harmonic frequencies, so the aliasing must be very carefully controlled to produce a quality similar to analog sound generation methods, requiring intensive DSP resources.

SUMMARY

An objective of the present invention is to provide a digitally controlled oscillator, a synthesizer module, a synthesizer, and a method for producing an electrical audio signal. Another objective of the present invention is that the digitally controlled oscillator, the synthesizer module, the synthesizer, and the method at least alleviate some of the drawbacks in the known solutions, such as related to the aliasing as described above. Furthermore, the present invention provides a simpler way to produce an electrical audio signal comprising a plurality of audio characteristics.

The objectives of the invention are reached by a digitally controlled oscillator, a synthesizer module, a synthesizer, and a method for producing an electrical audio signal as defined by the respective independent claims.

According to a first aspect of the present invention, a digitally controlled oscillator for a synthesizer module is provided. The digitally controlled oscillator comprises a digital processing unit, such as a STM32F103RGT6 microcontroller (MCU), configured to generate a first pulse wave at a first output, such as at pin PA8 of MCU's TIM1 timer. The first pulse wave is arranged to include pulses at at least two different first frequencies, for example, at 75 Hz and 77 Hz. The digitally controlled oscillator further comprises a summing circuit and a linear wave shaper, wherein the linear wave shaper comprises an integrator, such as an essentially ideal integrator or, preferably, a non-ideal, or leaky, integrator. The first output of the processing unit is connected to the summing circuit, and the summing circuit is arranged to produce a resultant signal based on at least the first pulse wave. The resultant signal is arranged to be fed into the linear wave shaper which is arranged to produce an output signal, such as an electrical audio signal for converting to corresponding sound in a speaker, at the output of the oscillator based on modifying the resultant signal, wherein the modifying comprises at least integration of the resultant signal.

Thus, producing the output signal, preferably, includes, optionally among other things, producing the resultant signal which comprises, at least from a mathematical point of view, a derivative or, optionally higher, derivatives, or slopes, of the desired output signal. The linear wave shaper is then arranged to shape, at least by integration, the resultant signal into the desired output signal.

In various embodiments, the digitally controlled oscillator may comprise a DC (direct current)-offset voltage supply, such as a digital-to-analog output of the processing unit, connected to the summing circuit for producing a DC-offset voltage, wherein the resultant signal is further produced based the DC-offset voltage.

In various embodiments, the digitally controlled oscillator may comprise the digital processing unit configured to generate a second pulse wave at a second output of the processing unit, wherein the second pulse wave is arranged to include pulses at at least two different second frequencies. The second output of the processing unit is connected to the summing circuit, and the summing circuit is arranged to produce the resultant signal at its output based on at least the first and the second pulse waves. The resultant signal may, optionally, be based also on the DC-offset voltage.

In some embodiments, the at least two different first frequencies may correspond to the at least two different second frequencies, respectively.

In various embodiments, the linear wave shaper may comprise an active filter, preferably an active second order band-pass filter. Alternatively, the linear wave shaper may comprise a passive filter connected to an amplifier.

In some embodiments, the active filter may comprise a first operational amplifier, an output of the first operational amplifier is in connection with the output of the oscillator, wherein the first operational amplifier comprises a non-inverting input and an inverting input. The active filter may further comprise a first resistor connected between the output of the first operational amplifier and the inverting input. The active filter may further comprise a first capacitor, a first terminal of which is connected to the inverting input and a second terminal of the first capacitor is in connection with an input of the linear wave shaper. Still further, the active filter may comprise a second capacitor connected between the output of the first operational amplifier and the second terminal of the first capacitor.

In various embodiments, the summing circuit may comprise a first input, a second input, and, optionally, a third input, wherein the first input is in connection with the first output of the processing unit and the second input is in connection with the DC-offset voltage supply, such as the digital-to-analog output of the processing unit, and, optionally, the third input is in connection with the second output of the processing unit.

In various embodiments, the summing circuit may be arranged to form a single pulse wave at a common coupling point based on at least the first pulse wave, a voltage of the DC-offset voltage supply, and, optionally, the second pulse wave, and wherein the resultant signal is based on the single pulse wave.

The common coupling point may refer to the point in the electronic circuit of the oscillator in which at least two of the first pulse wave, the second pulse wave, and the DC-offset voltage, or at least two of the signals based on the first pulse wave, the second pulse wave, and the DC-offset voltage, are combined into one electrical signal, that is, into the single pulse wave.

In an embodiment, the summing circuit may comprise a first semiconductor switch, such as a MOSFET. The first semiconductor switch may arranged to be controlled by its control terminal by the first pulse wave. A first terminal of the first semiconductor switch may be connected to a second voltage supply and a second terminal of the first semiconductor switch may be connected to the common coupling point.

Alternatively or in addition, the summing circuit may comprise a second semiconductor switch, such as a MOSFET. The second semiconductor switch may be arranged to be controlled by its control terminal by the second pulse wave. A first terminal of the second semiconductor switch may be connected to a third voltage supply and a second terminal of the second semiconductor switch may be connected to the common coupling point.

In various embodiments, the summing circuit may comprise a digital buffer arranged between the processing unit and the common coupling point.

In various embodiments, the summing circuit may comprise an inverting amplifier arranged between the common coupling point and the linear wave shaper.

According to a second aspect of the present invention, a synthesizer module is provided. The synthesizer module comprises at least one digitally controlled oscillator according to the first aspect or any embodiment thereof. The synthesizer module further comprises a user interface for controlling the at least one digitally controlled oscillator, wherein the user interface is at least in functional connection with an input of the at least one digitally controlled oscillator. For example, the user interface may comprise a plurality of rotatable knobs for controlling, in response to rotating of a knob, the setting(s) of the oscillator, such as related to the waveform of the output signal of the oscillator. In various embodiments, there may be arranged MIDI (Musical Instrument Digital Interface) as the user interface for controlling the operation of the oscillator.

According to a third aspect of the present invention, a synthesizer is provided. The synthesizer comprises at least one digitally controlled oscillator according to the first aspect or any embodiment thereof. The synthesizer further comprises a keyboard, such as a musical keyboard, including a plurality of keys, wherein the keyboard is at least in functional connection with an input of the at least at least one digitally controlled oscillator, and, optionally, a speaker in connection with the output of at least at least one digitally controlled oscillator.

According to a fourth aspect of the present invention a method for producing an electrical audio signal is provided. The method comprises at least the steps of:

generating a first pulse wave by a digital processing unit, the first pulse wave comprising pulses at at least two different first frequencies, producing a resultant signal based on at least the first pulse wave, and filtering the resultant signal by a linear wave shaper, such as comprising an active filter or a passive filter in connection with an amplifier, for generating the electrical audio signal.

In some embodiments, the method may comprise generating a second pulse wave by the digital processing unit, the second pulse wave comprising pulses at at least two different second frequencies, and producing the resultant signal based on at least the first pulse wave and the second pulse wave.

The present invention provides advantages over known solutions in that a plurality or, preferably, a large number of independent waveforms can be generated with no or at most with a small increase in the component count. Furthermore, the high frequency resolution and absence or low level of aliasing typical of the DCO based solutions are retained.

Various other advantages will become clear to a skilled person based on the following detailed description.

The expression "a number of" may herein refer to any positive integer starting from one (1).

The expression "a plurality of" may refer to any positive integer starting from two (2), respectively.

The terms "first", "second", "third", "fourth" etc. are herein used to distinguish one element from other element, and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also un-recited features. The features recited in depending claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION OF SOME EMBODIMENTS

Figure 1:
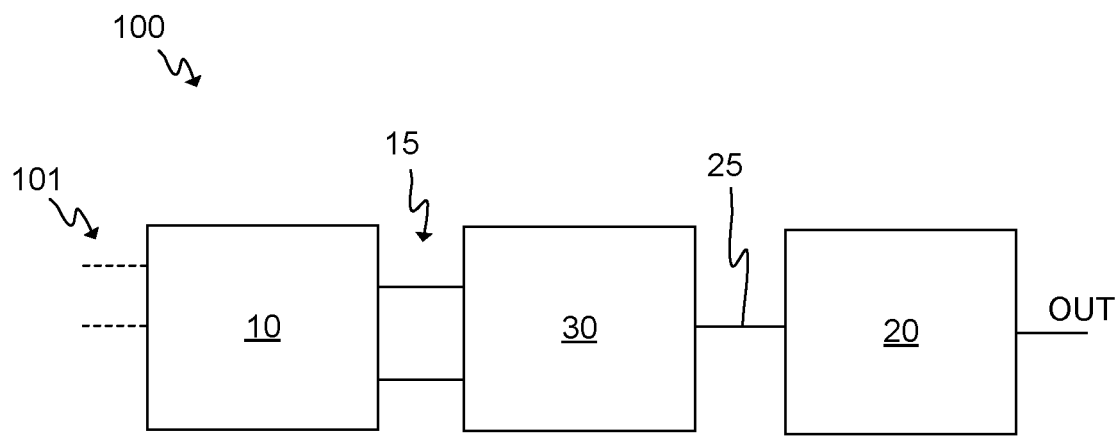
FIG. 1 illustrates highly schematically a digitally controlled oscillator according to an embodiment of the present invention.

FIG. 1 illustrates highly schematically a digitally controlled oscillator 100 according to an embodiment of the present invention. The digitally controlled oscillator 100 comprises a processing unit 10, such as an MCU, and a linear wave shaper 20, such as including an active filter. The processing unit 10 may be connected to the linear wave shaper 20 via a summing circuit 30. The summing circuit 30 is arranged to sum or combine a plurality of signals at the input 15 of the summing circuit 30 to form a resultant signal at the output 25 of the summing circuit 30. The resultant signal at 25 is furthermore arranged to be fed into the linear wave shaper 20 for obtaining an output signal at the output OUT of the oscillator 100. Furthermore, there may be oscillator inputs 101, such as to be arranged in connection with a user interface of a synthesizer module and/or with a keyboard of a synthesizer.

Figure 2:
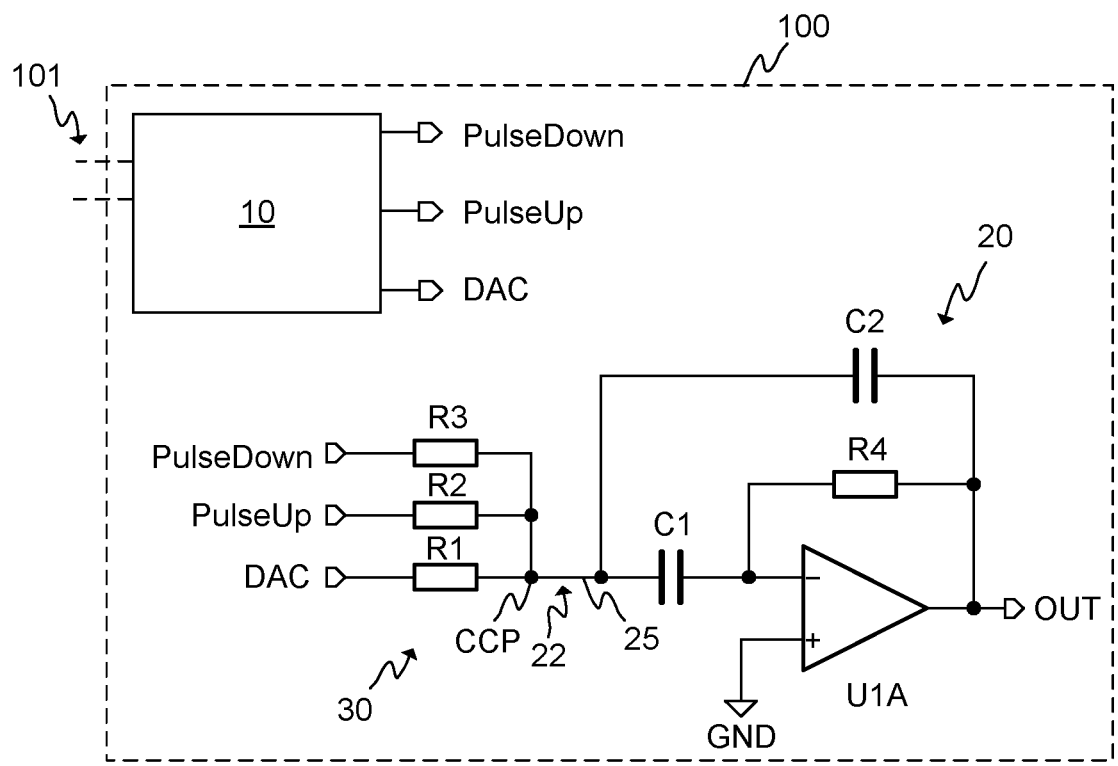
FIG. 2 illustrates schematically a digitally controlled oscillator according to an embodiment of the present invention.

FIG. 2 illustrates schematically a digitally controlled oscillator 100 according to an embodiment of the present invention. In FIG. 2, GND refers to the ground potential and OUT to the output of the oscillator 100.

In FIG. 2, the oscillator 100 may comprise a processing unit 10, such as a microcontroller (MCU). The MCU may utilize an external 8 MHz crystal to produce a main clock rate of 72 MHz. In an embodiment, the MCU may be, for example, STM32F103RGT6 microcontroller manufactured by STMicroelectronics® or the like.

For the first operational amplifier U1A, a quarter of TL074 operational amplifier or the like may be utilized. The operational amplifier may be chosen based on the desired properties thereof.

The first terminals of the resistors R1, R2, and R3 may be connected to the inputs DAC, PulseUp, and PulseDown, respectively, of the summing circuit 30. The second terminals of the resistors R1-R3 may be connected to each other as can be seen in FIG. 2.

The linear wave shaper 20 may be implemented by the first operational amplifier U1A and the surrounding passive network therein comprising resistor R4 and capacitors C1 and C2.

In some embodiments, the capacitor C1 may be part of the summing circuit 30 or be common to both the summing circuit 30 and the linear wave shaper 20.

In an exemplifying embodiment, such as shown in FIG. 2, the component values may be as follows: R1=R2=100 k$\Omega$, R3=278 k$\Omega$, R4=820 k$\Omega$, C1=330 nF and C2=40 nF. The operation of the oscillator is dependent on the ratios of the component values, so multiplying all component values by the same positive real number provides an oscillator 100 that works essentially the same way as the one with the above-mentioned component values.

Furthermore, as can be seen in FIG. 2, the processing unit 10 may be configured to generate at least two output signals, namely, PulseUp and/or PulseDown, and DAC.

In an embodiment, the PulseDown and PulseUp signals may be generated by the MCU's TIM1 and TIM8 timers PWM outputs on pins PA8 and PC6, respectively. The DAC output may be generated from the MCU's internal DAC2, on output pin PA5. The DAC output may be further buffered by a voltage follower using, for example, a quarter of a TL074 operational amplifier (not shown).

Figure 3:
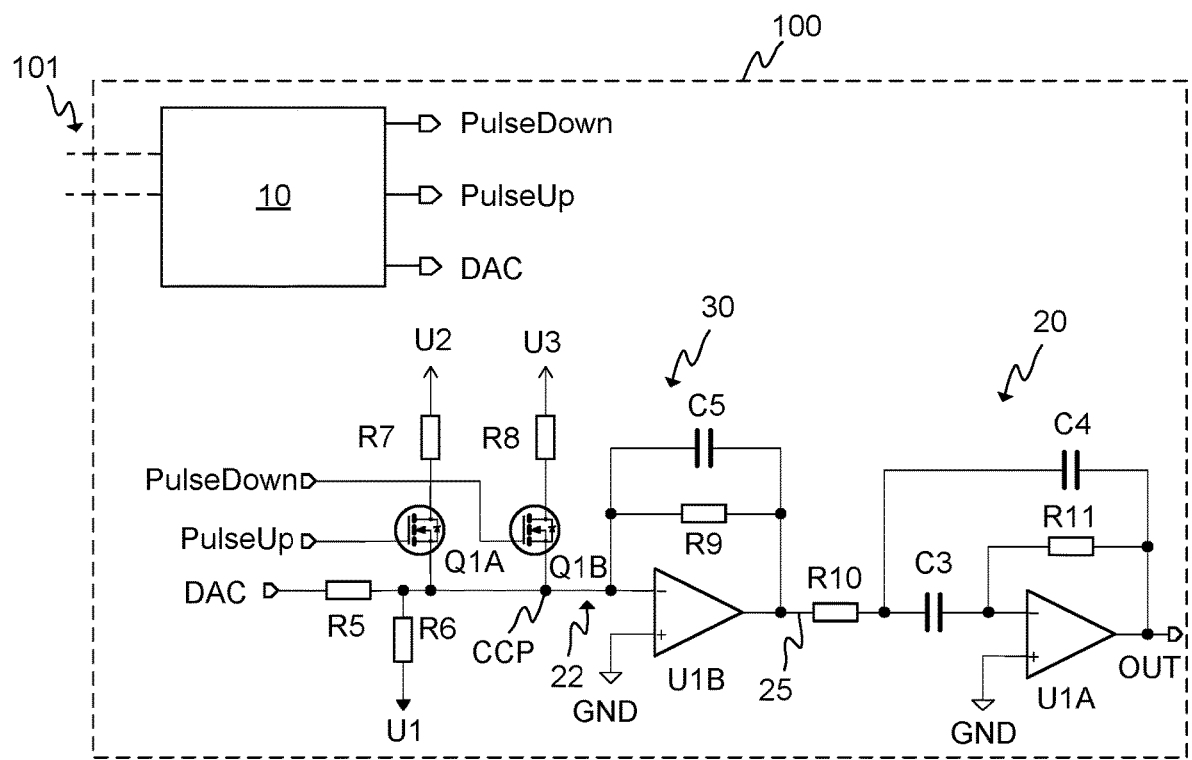
FIG. 3 illustrates schematically a digitally controlled oscillator according to an embodiment of the present invention.

FIG. 3 illustrates schematically a digitally controlled oscillator 100 according to another embodiment of the present invention. The oscillator 100 may, preferably, be used as an oscillator in a "Eurorack"-format modular audio synthesizer. In FIG. 3, the oscillator 100 comprises an MCU, such as the STM32F103RGT6 microcontroller, utilizing an external 8 MHz crystal to produce a main clock rate of 72 MHz.

Furthermore, the PulseDown and PulseUp signals may be produced by the MCU's TIM1 and TIM8 timers PWM outputs on pins PA8 and PC6, respectively. TIM1 and TIM8 timers PWM outputs and pins PA8 and PC6, per se, are known to a person skilled in art. The DAC output may be generated from the MCU's internal DAC2 on output pin PA5, and buffered by a voltage follower using a quarter of a TL074 operational amplifier (not shown).

In some embodiments, the linear wave shaper 20 may be implemented with any of the standard op-amp bandpass filter configurations, such as Sallen-Key, state variable, ladder with feedback and so on.

In preferable embodiments, the linear wave shaper 20 may be based on a multiple feedback (MFB)-topology. In FIG. 3, the linear wave shaper 20 is implemented by operational amplifier U1A and the surrounding passive network comprising resistors R10, R11 and capacitors C3 and C4.

In an embodiment, such as shown in FIG. 3, the component values may be as follows: R5=82 k$\Omega$, R6=56 k$\Omega$, R7=22 k$\Omega$, R8=22 k$\Omega$, R9=47 k$\Omega$, R10=18 k$\Omega$, R11=820 k$\Omega$, and C3=330 nF, C4=8.2 nF, and, an optional component, C5=33 pF.

In case of FIG. 3, the cutoff, asymptotic gain at large w and Q of the filter of the linear wave shaper 20 may be approximated by equations (EQ1)-(EQ3) as follows:

$$\omega_C = \frac{1}{\sqrt{R10 R11 C3 C4}} \approx 2\pi 25 \text{ Hz}, \tag{EQ1}$$

and $$Q = \frac{\sqrt{\frac{R11}{R10} C3 C4}}{C3 + C4} \approx 1, \tag{EQ2}$$

and $$\omega_g = -\frac{1}{R10 C4} \approx -2\pi 1080 \text{ Hz}. \tag{EQ3}$$

Furthermore, the linear wave shaper 20 may be fed by the summing circuit 30 around the operational amplifier U1B. In the summing circuit 30, the DAC signal may arranged to be amplified, such as at least partly based on the ratio of R9 to R5. The PulseDown and PulseUp signals from the processing unit 10, such as an MCU, are configured to control MOSFET switches Q1A, Q1B, for example, a DMN63D8LDW logic-level gate MOSFET pair, for connecting the analog supply voltage(s) U2 and U3, for example 3.3 V, at the summing circuit 30. By utilizing the switches Q1A and Q1B, connecting the noisy digital supply (which provides power to the MCU) directly to the audio circuit, which can produce detectable interference, is being avoided. In FIG. 3, U1 is a first voltage supply supplying, for example, −10 V.

In the example of FIG. 3, when PulseUp is high (that is Q1A is conducting), it shifts the output voltage of U1B by −3.3 V multiplied by the ratio of R9 to R7, and the same holds for PulseDown, however, with the ratio of R9 to R8. Finally, R6 uses U1 of −10 V voltage reference to shift the output down, such that when all of the pulses are in their inactive state (low for PulseDown, high for PulseUp) and the DAC is at mid-value, the summing circuit 30 output is approximately at ground potential GND, or somewhat higher, at about 0.4 V, to allow for maximum headroom. The absolute voltage values presented herein depend, of course, on the particular choice of the component values.

Additionally, the optional component C5 may be arranged to limit the amplifier bandwidth, for example, to about 100 kHz, to suppress very high frequency interference from the digital side of the oscillator 100.

In the configuration of FIG. 3, when PulseUp pulses to its active-low state, it produces an output pulse of about 7 V (inverting amplifier), and when PulseDown pulses to its active-high state, it produces a −7 V pulse. The DAC has about plus/minus 1 V control range. The small DC (direct current) voltage offset due to the inexact shift plays insignificant role, since the linear wave shaper 20 has zero DC response. For U1B, a quarter of a TL074 operational amplifier may be used, with the remaining half buffering the MCU DAC output and providing the final line driver and amplifier for the output stage of the oscillator 100.

The oscillator 100 according to various embodiments may configured to generate sawtooth, pulse and/or various other waveforms at its output OUT.

Figure 4A:
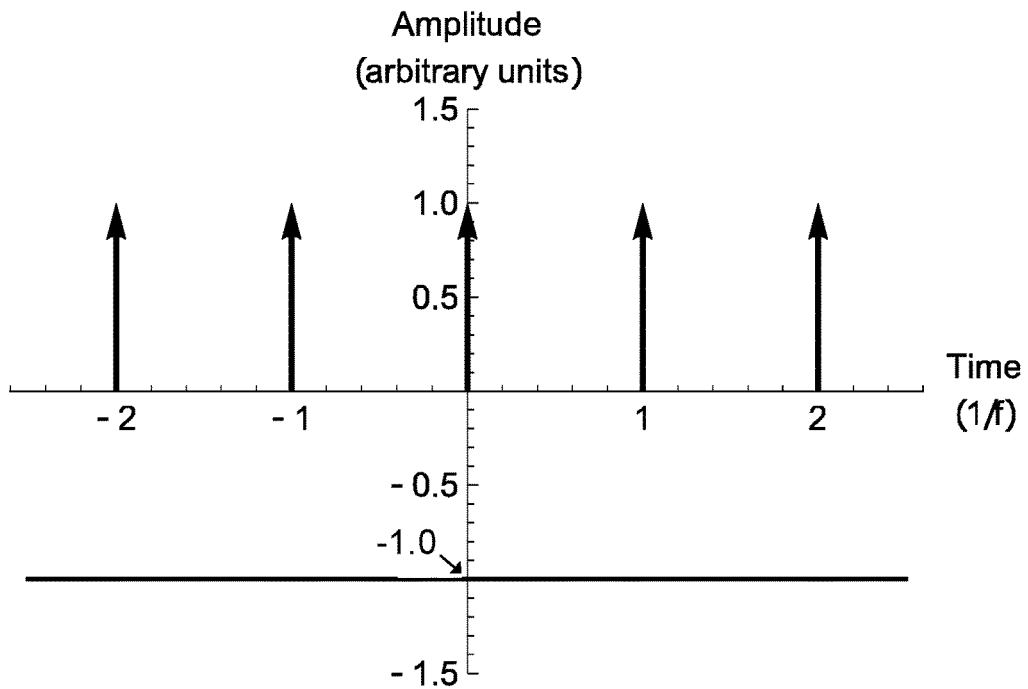
FIG. 4A illustrates Dirac deltas with integral given by the length of the arrow.
Figure 4B:
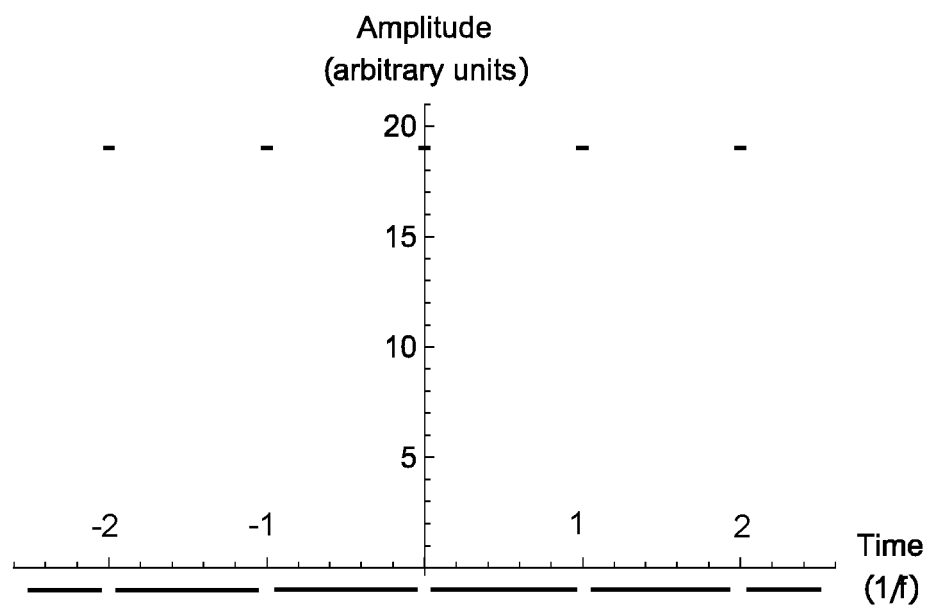
FIG. 4B illustrates schematically approximations of the Dirac deltas by finite width pulses in accordance with an embodiment of the present invention.

According to an embodiment, the oscillator 100 may be configured to generate a sawtooth waveform at its output OUT. This may be implemented by arranging an impulse train superimposed by a small DC-offset. In an analog system, a train of finite pulses (generated by a clock circuit or an MCU) may be used to approximate the Dirac deltas. This principle is illustrated in FIGS. 4A and 4B which schematically illustrate derivative of the ideal sawtooth waveform. The arrows in FIG. 4A depict Dirac delta functions with integral given by the length of the arrow. FIG. 4B shows approximation of Dirac deltas by finite width pulses. The finite pulses may be in the range of a duty cycle from about 0.01 to 0.2, for instance. In case of FIG. 4B, the duty cycle is about 0.05.

There is an approximation error which stems from the finite width of the pulses, and the finite time resolution of the pulse times. In audio application, the highest frequency of interest may be taken to be f_max=20 kHz. In this case the maximum approximation error for a 0.5-1 μs pulse, that is with a duty cycle of 0.01-0.02, is approximately less than or equal to −0.006 dB. Even for a 10 μs pulse, that is with a duty cycle of 0.2, the error is approximately equal to −0.6 dB.

In order to keep a constant approximation error, the oscillator 100 may be configured to keep the pulse length (as opposed to the duty cycle) fixed even when the oscillator frequency varies. The finite time resolution error may be removed by quantizing the period to the closest integer number of clock cycles. In the case of audiorate applications, the highest periods of interest are some kilohertz, and the audio range extends up to 20 kHz. Then an oscillator 100 having the main clock rate of 72 MHz allows a frequency resolution of one part in 36000 at 2 kHz or about 0.05 cents in musical notation, which is considerably better than the resolution of human pitch perception. Therefore, the embodiments of the present invention work very well for audiorate systems, and could easily be extended at least some octaves above audio rates in other applications.

In order to generate the DC offset part, which is frequency dependent, a voltage proportional to the frequency is generated from a DAC. At a constant oscillator frequency, the DAC output is constant, so the oscillator 100 remains alias free regardless of the sample rate of the DAC. If the frequency is varied, then the frequency control signal is aliased as determined by the DAC's sample rate, but there is still minimal or no further aliasing in the oscillator 100 according to various embodiments of the present invention.

After generation of the pulses as illustrated, for instance, in FIG. 4B, the pulse train may, preferably, be converted into a sawtooth wave.

The conversion may be implemented in an embodiment by a linear wave shaper 20 comprising an integrator in which there may be an integrator pole which is slightly offset from the origin (in other words, the integrator is leaky) in the Laplace plane with respect to an ideal integrator, changing the transfer function from $\omega_g/s$ to $\omega_g/(s+p_0)$, where $p_0$ is a positive real number which is small compared to the smallest frequency of interest.

According to a preferable embodiment, the linear wave shaper 20 may comprise an integrator that may be implemented by placing a zero at the origin and replacing the pole by a complex pair of poles, thus giving a second-order bandpass response, which may be described by equation (EQ4) as follows:

$$H(s) = \frac{k \dfrac{s}{\omega_c}}{1 + \dfrac{1}{Q}\dfrac{s}{\omega_c} + \dfrac{s^2}{\omega_c^2}}, \tag{EQ4}$$

where $\omega_c$ is the cutoff (angular) frequency, Q determines the amount of peaking in the response and the gain k=$\omega_g/\omega_c$, in order to have asymptotic gain of the same order at high frequencies. Furthermore, the ratio of the response H(s) to the ideal response $\omega_g/s$ is $$H(s) = \frac{k \frac{s^2}{\omega_c^2}}{1 + \frac{1}{Q}\frac{s}{\omega_c} + \frac{s^2}{\omega_c^2}}. \quad (EQ5)$$

Therefore, adding the low frequency zero effectively filters the output signal with a second order high-pass filter (HPF) relative to the ideal case. The parameter $\omega_c$ is the cutoff point of the HPF, and Q determines the peaking of the response.

Choosing $\omega_c$ may be based on choosing the lowest frequency of interest, f_min. The choice may be affected by the fact that the higher the cutoff, the faster the DC offset errors settle (and the smaller the total energy in them).

Choosing Q may be based on reducing the total amplitude or energy with response to a step input. As an example, numerically minimizing the peak value of the step response of the filter, with a fixed $\omega_c$, gives Q=1.354.

In various embodiments, the oscillator 100 comprising the linear wave shaper 20 as described above may produce an output signal which may be used to generate a sound that includes a slight bass boost and a slight high frequency droop which may be considered beneficial, depending on the application. The sound is, thus, slightly more warm and solid than that with an oscillator having a mathematically ideal integrator.

According to various embodiments of the present invention, the essential point is that the wave shaper 20 is substantially linear. This allows moving the summing unit 30 to the front of the wave shaper 20, i.e. the pulses generated by the processing unit may be combined, such as summed, in the summing circuit 30 and then advantageously only one wave shaper 20 may be utilized for modifying the resultant signal in the output of the summing circuit 30 and which is being fed to the wave shaper 20.

Therefore, in contrast to known solutions in which N pulsetrains and N DAC signals are fed to N identical wave shapers, whose outputs are then summed to produce the final output waveform, the N DAC signals can in various embodiments of the present invention be combined by summing the offset voltages digitally before the conversion in the processing unit 10.

Thus, the hardware needed for generating N sawtooths, for instance, can be reduced to a single linear wave shaper 20, single DAC for producing DAC signal, and N pulse wave generators. This is may be implemented, for example, by a STM32-series microcontrollers that have up to 12 independent timers with PWM generation and a built-in 12-bit DAC, so such a controller equipped with the wave shaper 20 and a summing circuit 30 comprising a simple operational amplifier for the DAC and PWM outputs could generate 12 sawtooths with independent frequencies and amplitudes.

In known solutions, concerning the summing of the pulses, assuming the pulse width multiplied by the number of oscillators is small relative to the oscillator periods, most of the time simply 0 is being added to 1, since at any given time usually only one of the pulses is in its active state. Therefore, in various embodiments of the present invention, the pulses may be combined by interleaving the pulse trains in the processing unit 10 digitally to produce a single pulse train for outputting from a single pin of the processing unit 10.

However, in the rare case that the pulses do overlap, in various embodiments, one or more of the overlapping pulses are not ignored, since that would produce a DC error of the same amplitude as the waveform to be generated. While the error would decay away due to the wave shaper 20, a glitch due to the omission of one or more of the overlapping pulses would be clearly detectable.

In various embodiments, the lengths of the overlapping pulses may be added so that a single longer pulse is produced.

Figure 5A:
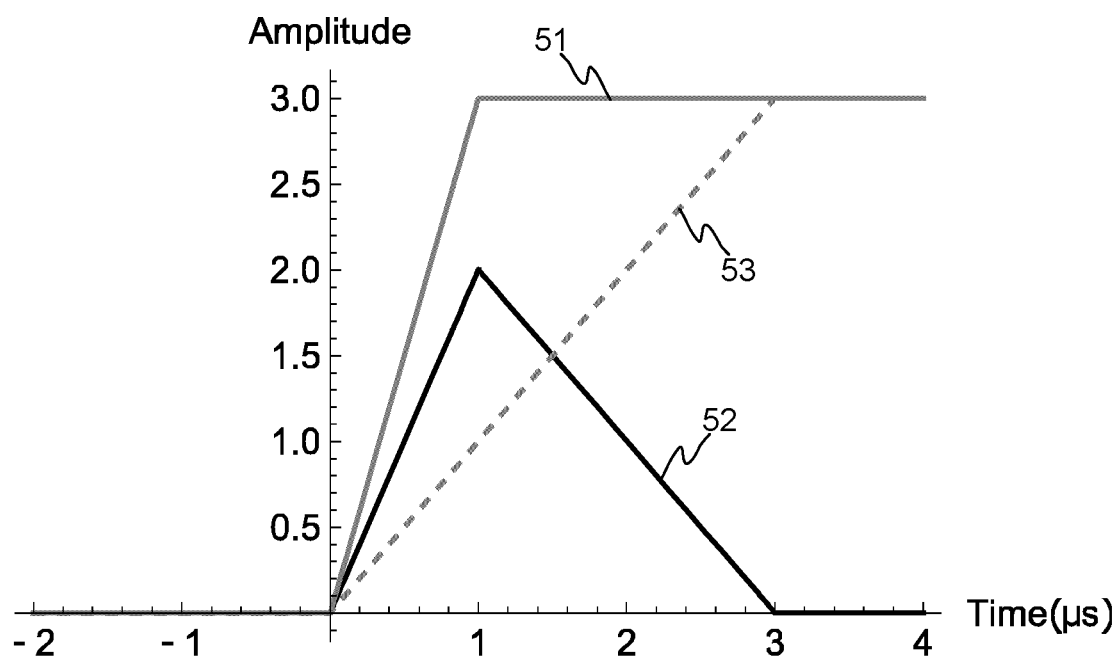
FIGS. 5A and 5B illustrate schematically combining of overlapping pulses in accordance with some embodiments of the present invention.

The addition to form the single longer pulse may in some embodiments be implemented by starting the longer pulse at the same time as the first of the overlapping pulses 51 to be combined, and then continue for an extended time to settle at the correct DC-level. In this case, the error pulse 52 is entirely positive, contributing mostly low-frequency energy. This is illustrated in FIG. 5A in which three perfectly overlapping pulses 51 are being combined into single longer pulse 53, each of the overlapping pulses being one microsecond long. FIG. 5A shows that the longer pulse 53 that starts at the pulse time of the overlapping pulses 51. The amplitude in FIG. 5A is relative to the sawtooth peak-to-peak amplitude.

Figure 5B:
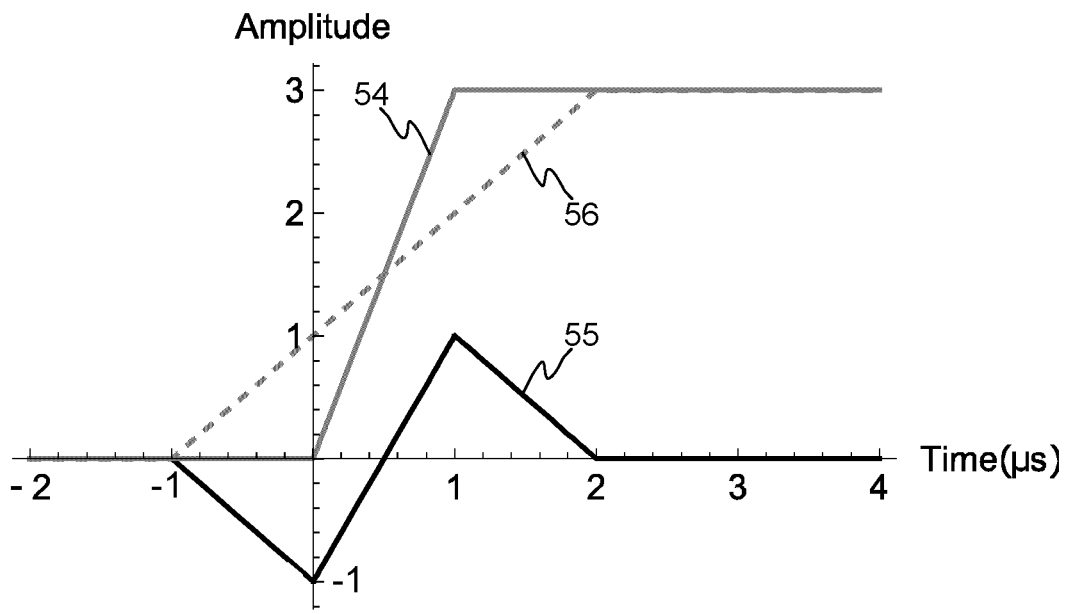

According to another embodiment, the addition to form the single longer pulse 56 may be implemented by shifting the combined pulse 56 to occur symmetrically around the original, overlapping pulse 54 times, thus eliminating the low-frequency part of the error 55. This is illustrated in FIG. 5B which shows the longer pulse 56 occurring symmetrically around the overlapping pulses 54. In FIG. 5B, three perfectly overlapping pulses 54 are being combined into one longer pulse 56, each of the overlapping pulses 54 being one microsecond long. The amplitude in FIG. 5B is relative to the sawtooth peak-to-peak amplitude.

The embodiment, the operation of which is illustrated in FIG. 5B, provides the advantage that in the non-symmetric case of FIG. 5A, the error due to the addition of pulse lengths of the overlapping pulses produces a sound much like a delta function, i.e. a sharp full-bandwidth click. In the symmetric case of FIG. 5B, the sound due to the error would be a much subdued, very high frequency blip if any of its energy even manifests in the audible region.

In the audio applications, no audible degradation occurs as long as the overlaps of the pulses are relatively infrequent. If they become more frequent, such as due to increasing frequency or increasing the number of oscillators in the system, in the embodiment of FIG. 5A, the errors may manifest as a vinyl-like crackle. This may be further alleviated by implementing the addition of the overlapping pulses as in FIG. 5B.

The oscillator 100 according to various embodiments may, alternative or in addition, be configured to generate pulse waves.

The pulse wave may be produced by adding another pin that feeds the wave shaper to produce a falling edge of the pulse wave. In an embodiment, this may be implemented by an inverting amplifier. In effect, two streams of pulses, each output from their own pin of the processing unit 10, such as microcontroller may be generated.

According to some embodiments, in which the linear wave shaper 20 rejects any DC-offsets, the inverting amplifier may be omitted, if any, and feed the other pin also directly, simply making the pulse active-low. In other words, when not outputting a pulse for generating a falling edge, the pin of the processing unit 10 may be at the operating voltage of the processing unit 10. Thus, as the DC-offset gets removed by the wave shaper 20, after which a brief pulse where the pin is temporarily connected to ground manifests as a downward pulse.

The oscillator 100 according to various embodiments may be configured to generate also other waveforms than sawtooth and pulse waves.

The oscillator 100 may be configured to produce any combination of a single ramp superposed with rising and falling edges, whose heights can be controlled by adjusting the pulse duration. Further, the directions and magnitudes of the ramp part may be configured to be changed, producing waveforms such as the triangle, and more. Indeed, in some applications this enables to specify complicated waveforms that are piecewise linear with vertical edges.

According to an embodiment, the processing unit 10 may be a STM32F103 which features a DAC suitable for use to implement complicated waveforms as described above.

Various embodiments of the present invention allow a much lower sample rate for the DAC (only proportional to the highest desired oscillator period, not to the highest sinusoidal component of interest), and requires no explicit anti-aliasing in the software.

The software in the processing unit 10 may be given a list of oscillators (for example, up to 16), each having a waveform, period in number of ticks of the master 72 MHz clock, phase, and an amplitude, given in terms of the pulse width.

As an example, a sawtooth waveform only may be considered, however, the pulse waveform simply requires the other pulse generator to be driven with opposite polarity to produce the falling edges. The processing may be arranged to occur in 0.5 ms blocks. For each frequency, the next edge time can be determined from the period and the current phase. The frequency related data may be kept in a binary heap, sorted according to the next edge time. The top of the heap is popped, the corresponding edge (consisting of start time and duration) is added to an edge list, the oscillator phase is advanced by one cycle and it is reinserted to the heap. If the current edge overlaps with the previous one, the edges may be combined by adding their lengths. This is repeated until the next edge time is later than the boundary of the current 0.5 ms block. Oscillator parameters may be updated between the processing blocks.

The edge list allows building a list of wait-times between pulses and lengths of individual pulses. These may be fed to TIM8 compare channel 1, using DMA and the burst mode provided in the timer.

Equations concerning the operation of the oscillator 100 according to some embodiments, such as shown in FIG. 3, may be approximated as follows. If a pulse of length t_pulse is fed into the linear wave shaper 20, the wave shaper 20 outputs an edge of height V_p-p=t_pulse*$\omega_g$*V_pulse, where V_pulse=−3.3 V*(R9/R7), $\omega_g$ is given in (EQ3). This is an edge of the sawtooth wave. It also gives the peak-to-peak voltage of the output waveform for a single oscillator 100. In case of a 3 μs pulse as maximum, this gives a maximum peak-to-peak-voltage of about 140 mV.

Requiring that there is no accumulated DC shift during the period of the oscillator 100 gives an equation for the DAC output value according to which V_p-p=t_period*$\omega_g$*V_DAC, where t_period=1/f, the period of the sawtooth being generated and V_DAC is the amount by which the DAC must shift the output of the pulse summing circuit 30. This gives V_DAC=(t_pulse/t_period)*V_pulse.

When multiple oscillators are running the DAC output code is simply the sum of the corresponding codes. Note that the choice of the ratio (R5/R7), the pulse width (i.e. amplitude) together with the maximum number of simultaneous oscillators determines the frequency range at which the DAC is able to compensate the shifts. With our values, the range is 3 kHz for 16 oscillators and pulse width of 3 μs.

In various embodiments, in which the linear wave shaper 20 has zero DC response, an offset may be imposed on the DAC and effectively use it as bipolar, allowing for rising and falling ramps.

Figure 6:
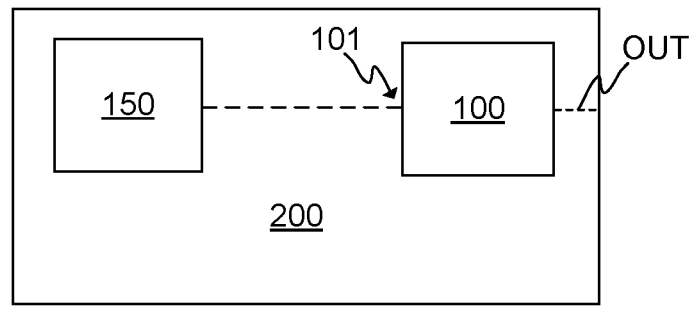
FIG. 6 illustrates schematically a synthesizer module according to an embodiment of the present invention.

FIG. 6 illustrates schematically a synthesizer module 200 according to an embodiment of the present invention. The synthesizer module 200 may comprise at least one or a plurality of digitally controlled oscillators 100 according to an embodiment of the present invention. The synthesizer module 200 may further comprise a user interface 150 for controlling the at least one or the plurality of digitally controlled oscillator 100, wherein the user interface 150 is at least in functional connection with an input 101 of the at least one or inputs of the plurality of digitally controlled oscillators 100.

The user interface 150 of the synthesizer module 200 may, according to various embodiments may, comprise several means for controlling, such as knobs, the operation of the oscillator(s) 100. These may be arranged to select a waveform of the output signal of the oscillator 100, such as a sawtooth or a pulse wave, for instance. The user interface 150 may further include various inputs or outputs such as in known synthesizer modules 200.

In various embodiments, the synthesizer module 200 may comprise a housing into which its components have been arranged into. The user interface 150 may be arranged into the outer surface of the housing.

Figure 7:
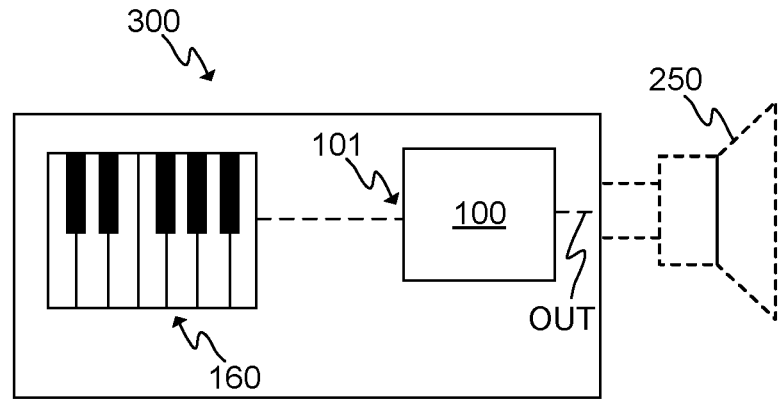
FIG. 7 illustrates schematically a synthesizer according to an embodiment of the present invention.

FIG. 7 illustrates schematically a synthesizer 300 according to an embodiment of the present invention. The synthesizer 300 may comprise at least one or a plurality of digitally controlled oscillators 100 according to an embodiment of the present invention. Alternatively, the synthesizer 300 may comprise a keyboard 160, such as a musical keyboard, including a plurality of keys, wherein the keyboard 160 is at least in functional connection with an input 101 of the at least at least one digitally controlled oscillator 100. Optionally, there may be a speaker 250 in connection with the output OUT of at least at least one or a plurality of digitally controlled oscillators 100.

Alternatively, the synthesizer 300 may comprise a synthesizer module 200 according to some embodiment of the present invention. Thus, the synthesizer 300 may comprise the user interface 150 of the module 200. The user interface 150 may, preferably, be separate with respect to the keyboard 160.

Furthermore, the keyboard 160 may be arranged in an integrated manner or separately, notwithstanding the electrical connections to the module 200.

Figure 8:
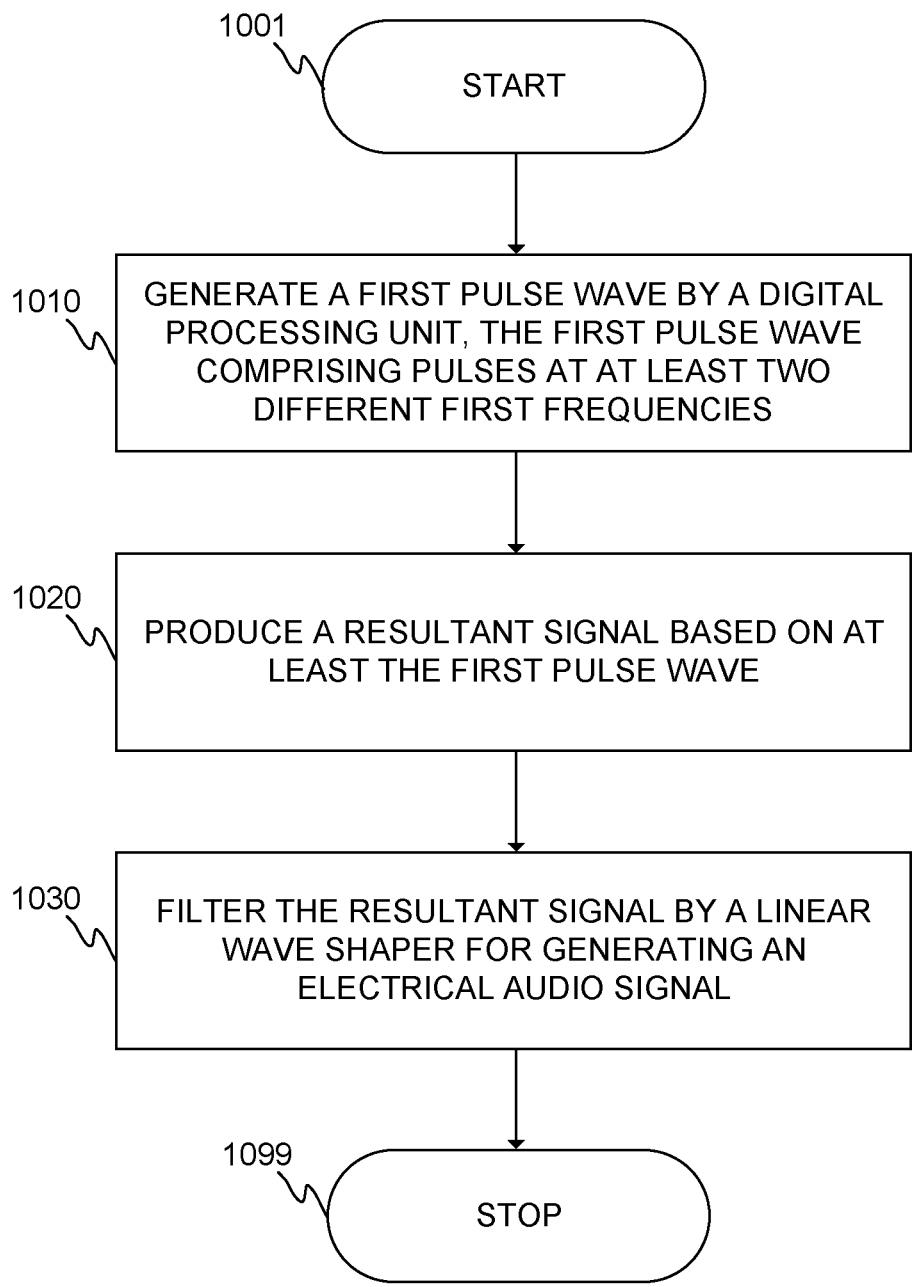
FIG. 8 illustrates a flow diagram of a method according to an embodiment of the present invention.

FIG. 8 illustrates a flow diagram of a method according to an embodiment of the present invention.

It is to be noted, however, that what is described hereinabove with respect to FIGS. 1-7 may also apply to methods according to some embodiments of the present invention. For example, the components used and the way they are utilized as described therein may form part of an embodiment of the method. The methods according to various embodiments of the present invention should not, however, be interpreted to be limited only to what is presented with respect to FIGS. 1-7.

Thus, item 1001 may refer to a start-up phase of the method. Suitable equipment and components, such as, but not limited to, oscillator(s) 100, is/are obtained and systems, for example, an arrangement including the oscillator(s) 100, a synthesizer module 200, a synthesizer 300, assembled and configured for operation.

Item 1010 may refer to generating a first pulse wave by a digital processing unit 10, the first pulse wave comprising pulses at at least two different first frequencies.

According to an embodiment, the method may comprise generating a second pulse wave by the digital processing unit 10, the second pulse wave comprising pulses at at least two different second frequencies.

Item 1020 may refer to producing a resultant signal based on at least the first pulse wave.

In some embodiments, the resultant signal may, alternatively or in addition, be based on at least the first pulse wave and the second pulse wave.

Item 1030 may refer to filtering the resultant signal by an active filter for generating the electrical audio signal.

Method execution may be stopped at item 1099. The electrical audio signal may be fed or injected into a speaker or loudspeaker for converting the electrical audio signal into sound.

The specific examples provided in the description given above should not be construed as limiting the applicability and/or the interpretation of the appended claims. Lists and groups of examples provided in the description given above are not exhaustive unless otherwise explicitly stated.

The invention claimed is:

1. A digitally controlled oscillator for a synthesizer module, wherein the oscillator comprises:
   a digital processing unit configured to generate a first pulse wave at a first output of the processing unit, wherein the first pulse wave is arranged to include pulses at at least two different first frequencies;
   a summing circuit;
   wherein the first output of the processing unit is connected to the summing circuit, and the summing circuit is arranged to produce a resultant signal based on at least the first pulse wave; and
   wherein the resultant signal is arranged to be fed into the linear wave shaper, wherein the linear wave shaper is arranged to produce an output signal, being an electrical audio signal including, as fundamental frequency components thereof, frequency components corresponding to the at least two different first frequencies, at the output of the oscillator based on modifying the resultant signal, wherein the modifying comprises at least integration of the resultant signal.

2. The digitally controlled oscillator claim 1, comprising a DC-offset voltage supply, such as a digital-to-analog output of the processing unit, connected to the summing circuit for producing a DC-offset voltage, wherein the resultant signal is further produced based the DC-offset voltage.

3. The digitally controlled oscillator of claim 2, wherein the summing circuit comprises a first input, a second input, and, optionally, a third input, wherein the first input is in connection with the first output of the processing unit and the second input is in connection with the DC-offset voltage supply, such as the digital-to-analog output of the processing unit, and, optionally, the third input is in connection with the second output of the processing unit.

4. The digitally controlled oscillator of claim 2, wherein the summing circuit is arranged to form a single pulse wave at a common coupling point based on at least the first pulse wave, a voltage of the DC-offset voltage supply, and, optionally, the second pulse wave, and wherein the resultant signal is based on the single pulse wave.

5. The digitally controlled oscillator of claim 4, wherein the summing circuit comprises a first semiconductor switch, such as a MOSFET, wherein the first semiconductor switch is arranged to be controlled by its control terminal by the first pulse wave, and wherein a first terminal of the first semiconductor switch is connected to a second voltage supply and a second terminal of the first semiconductor switch is connected to the common coupling point.

6. The digitally controlled oscillator of claim 4, wherein the summing circuit comprises a second semiconductor switch, such as a MOSFET, wherein the second semiconductor switch is arranged to be controlled by its control terminal by the second pulse wave, and wherein a first terminal of the second semiconductor switch is connected to a third voltage supply and a second terminal of the second semiconductor switch is connected to the common coupling point.

7. The digitally controlled oscillator claim 1, further comprising the digital processing unit configured to generate a second pulse wave at a second output of the processing unit, wherein the second pulse wave is arranged to include pulses at at least two different second frequencies, wherein the second output of the processing unit is connected to the summing circuit, and the summing circuit is arranged to produce the resultant signal at its output based on at least the first and the second pulse waves, and optionally the DC-offset voltage.

8. The digitally controlled oscillator of claim 7, wherein the at least two different first frequencies correspond to the at least two different second frequencies, respectively.

9. The digitally controlled oscillator of claim 1, wherein the linear wave shaper comprises an active filter, preferably an active second order band-pass filter.

10. The digitally controlled oscillator of claim 9, wherein the active filter comprises:
    a first operational amplifier, an output of the first operational amplifier is in connection with the output of the oscillator, wherein the first operational amplifier comprises a non-inverting input and an inverting input;
    a first resistor connected between the output of the first operational amplifier and the inverting input;
    a first capacitor, a first terminal of which is connected to the inverting input, wherein a second terminal of the first capacitor is in connection with an input of the linear wave shaper; and
    a second capacitor connected between the output of the first operational amplifier and the second terminal of the first capacitor.

11. The digitally controlled oscillator claim 1, wherein the summing circuit comprises
    a digital buffer arranged between the common coupling point and the linear wave shaper; or
    an inverting amplifier arranged between the common coupling point and the linear wave shaper.

12. A synthesizer module comprising
    at least one digitally controlled oscillator according to claim 1, and
    a user interface for controlling the at least one digitally controlled oscillator, wherein the user interface is at least in functional connection with an input of the at least one digitally controlled oscillator.

13. A synthesizer comprising
    at least one digitally controlled oscillator according to claim 1,
    a keyboard, such as a musical keyboard, including a plurality of keys, wherein the keyboard is at least in functional connection with an input of the at least at least one digitally controlled oscillator, and, optionally, a speaker in connection with the output of at least at least one digitally controlled oscillator.

14. A method for producing an electrical audio signal, wherein the method comprises:
generating a first pulse wave by a digital processing unit, the first pulse wave comprising pulses at at least two different first frequencies;
producing a resultant signal based on at least the first pulse wave; and
filtering the resultant signal by a linear wave shaper comprising an integrator for generating the electrical audio signal including, as fundamental frequency components thereof, frequency components corresponding to the at least two different first frequencies, wherein the filtering comprises at least integration of the resultant signal.

15. The method according to claim 14, comprising
generating a second pulse wave by the digital processing unit, the second pulse wave comprising pulses at at least two different second frequencies; and
producing the resultant signal based on at least the first pulse wave and the second pulse wave.

* * * * *